(12) United States Patent
Kim

(10) Patent No.: US 12,494,454 B2
(45) Date of Patent: Dec. 9, 2025

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventor: Sunjae Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 713 days.

(21) Appl. No.: 17/812,966

(22) Filed: Jul. 15, 2022

(65) Prior Publication Data

US 2023/0133322 A1 May 4, 2023

(30) Foreign Application Priority Data

Nov. 2, 2021 (KR) .................... 10-2021-0148489

(51) Int. Cl.
*H01L 23/00* (2006.01)
*H01L 23/48* (2006.01)
(Continued)

(52) U.S. Cl.
CPC .............. *H01L 24/73* (2013.01); *H01L 24/14* (2013.01); *H01L 24/20* (2013.01); *H01L 24/48* (2013.01);
(Continued)

(58) Field of Classification Search
CPC ......... H01L 24/73; H01L 24/14; H01L 24/20; H01L 24/48; H01L 25/0652; H01L 25/50;
(Continued)

(56) References Cited

U.S. PATENT DOCUMENTS 6,064,114 A  5/2000 Higgins, III
6,552,426 B2  4/2003 Ishio et al.
(Continued)

FOREIGN PATENT DOCUMENTS

JP  11-233687 A  11/1998
JP  2002083923  3/2002
(Continued)

OTHER PUBLICATIONS

Office Action dated Aug. 21, 2025 issued in corresponding to Korean Patent Application No. 10-2021-0148489.

*Primary Examiner* — Ajay Ojha
*Assistant Examiner* — Sandra Milena Rodriguez Villanu
(74) *Attorney, Agent, or Firm* — Morgan, Lewis & Bockius LLP

(57) ABSTRACT

A semiconductor package includes first bump structures that include a stud portion disposed below the second rear surface pads of the first group, and a bonding wire portion that extends from the stud portion and is connected to the first front surface pads of the first group; second bump structures disposed below the second rear surface pads of the second group; an encapsulant that encapsulates the second semiconductor chip and the first and second bump structures; and a redistribution structure disposed below the encapsulant, and that includes an insulating layer, redistribution layers disposed below the insulating layer, and redistribution vias that penetrate through the insulating layer and connect the redistribution layers to the first bump structures or the second bump structures. At least a portion of the redistribution vias connected to the first bump structures is in contact with the stud portion.

20 Claims, 12 Drawing Sheets

(51) Int. Cl.
  *H01L 25/00* (2006.01)
  *H01L 25/065* (2023.01)
  *H01L 25/18* (2023.01)

(52) U.S. Cl.
  CPC .......... *H01L 24/92* (2013.01); *H01L 25/0652* (2013.01); *H01L 25/50* (2013.01); *H01L 23/481* (2013.01); *H01L 24/08* (2013.01); *H01L 24/16* (2013.01); *H01L 24/19* (2013.01); *H01L 24/45* (2013.01); *H01L 24/49* (2013.01); *H01L 25/18* (2013.01); *H01L 2224/08145* (2013.01); *H01L 2224/16145* (2013.01); *H01L 2224/211* (2013.01); *H01L 2224/214* (2013.01); *H01L 2224/215* (2013.01); *H01L 2224/224* (2013.01); *H01L 2224/45116* (2013.01); *H01L 2224/45124* (2013.01); *H01L 2224/45139* (2013.01); *H01L 2224/45144* (2013.01); *H01L 2224/45147* (2013.01); *H01L 2224/48108* (2013.01); *H01L 2224/48149* (2013.01); *H01L 2224/48464* (2013.01); *H01L 2224/48496* (2013.01); *H01L 2224/49171* (2013.01); *H01L 2224/73204* (2013.01); *H01L 2224/73207* (2013.01); *H01L 2224/73215* (2013.01); *H01L 2224/73257* (2013.01); *H01L 2224/73265* (2013.01); *H01L 2224/9211* (2013.01); *H01L 2224/92127* (2013.01); *H01L 2224/92147* (2013.01)

(58) Field of Classification Search
  CPC ....... H01L 23/481; H01L 24/08; H01L 24/16; H01L 24/19; H01L 24/45; H01L 24/49; H01L 25/18; H01L 2224/08145; H01L 2224/16145; H01L 2224/214; H01L 2224/224; H01L 2224/45116; H01L 2224/45124; H01L 2224/45139; H01L 2224/45144; H01L 2224/45147; H01L 2224/49171; H01L 2224/73207; H01L 2224/73215; H01L 2224/73257; H01L 2224/73265; H01L 2224/9211; H01L 24/42; H01L 2225/06506; H01L 2225/06513; H01L 2225/06517; H01L 2225/06524; H01L 2225/06541; H01L 2225/06586; H01L 2225/06589; H01L 24/13; H01L 23/4824; H01L 21/50; H01L 21/60; H01L 23/31; H01L 23/488; H01L 23/49811; H01L 23/49827; H01L 23/49838; H01L 23/5226; H01L 23/528; H01L 23/535; H01L 23/5384; H01L 23/5386; H01L 24/10
  See application file for complete search history.

(56) References Cited

U.S. PATENT DOCUMENTS

| | | | |
|---|---|---|---|
| 10,008,469 | B2 | 6/2018 | Katkar et al. |
| 2002/0041027 | A1 | 4/2002 | Sugizaki |
| 2005/0116353 | A1 | 6/2005 | Fujitani et al. |
| 2015/0123268 | A1 | 5/2015 | Yu et al. |
| 2015/0340305 | A1 | 11/2015 | Lo |
| 2016/0071818 | A1* | 3/2016 | Wang ................. H01L 24/49 |
| | | | 257/773 |
| 2016/0155268 | A1 | 6/2016 | Ko |
| 2022/0278065 | A1* | 9/2022 | Lee .................... H01L 23/16 |

FOREIGN PATENT DOCUMENTS

| | | |
|---|---|---|
| JP | 2005183923 A | 7/2005 |
| JP | 2010-093106 A | 4/2010 |
| KR | 1020070067383 | 6/2007 |
| KR | 10-2015-0139230 A | 12/2015 |

* cited by examiner

C

SEMICONDUCTOR PACKAGE AND METHOD OF MANUFACTURING THE SAME

CROSS-REFERENCE TO RELATED APPLICATION(S)

This application claims priority under 35 U.S.C. § 119 from Korean Patent Application No. 10-2021-0148489, filed on Nov. 2, 2021 in the Korean Intellectual Property Office, the contents of which are herein incorporated by reference in their entirety.

TECHNICAL FIELD

Embodiments of the present inventive concept are directed to a semiconductor package and a method of manufacturing the same.

DISCUSSION OF THE RELATED ART

A semiconductor package mounted on an electronic device is miniaturized to have high performance and high capacity. To accomplish these aims, semiconductor packages in which semiconductor chips that include a through-silicon-via (TSV) are vertically stacked are being studied.

SUMMARY

An embodiment of the present inventive concept provides a semiconductor package that has a simplified manufacturing process and an increased yield, and a method of manufacturing the same.

According to an embodiment of the present inventive concept, a semiconductor package includes a first semiconductor chip that includes a first front surface on which first front surface pads of first and second groups are disposed; a second semiconductor chip that includes a second front surface that faces the first front surface and on which are disposed second front surface pads that are electrically connected to the first front surface pads of the second group, and a second rear surface opposite to the second front surface and on which are disposed second rear surface pads of first and second groups, and a through-electrode that electrically connects the second front surface pads and at least a portion of the second rear surface pads to each other; first bump structures that include a stud portion disposed below the second rear surface pads of the first group, and a bonding wire portion that extends from the stud portion and is connected to the first front surface pads of the first group; second bump structures disposed below the second rear surface pads of the second group; an encapsulant that encapsulates the second semiconductor chip and the first and second bump structures; and a redistribution structure disposed below the encapsulant, where the redistribution structure includes an insulating layer, redistribution layers disposed below the insulating layer, and redistribution vias that penetrate through the insulating layer and connect the redistribution layers to the first bump structures or the second bump structures. At least a portion of the redistribution vias connected to the first bump structures is in contact with the stud portion.

According to an embodiment of the present inventive concept, a semiconductor package includes a first semiconductor chip that includes first front surface pads of first and second groups; a second semiconductor chip that includes second front surface pads disposed below the first semiconductor chip and that are electrically connected to the first front surface pads of the second group, and second rear surface pads of first and second groups located opposite to the second front surface pads; first bump structures that include a stud portion disposed below the second rear surface pads of the first group, and a bonding wire portion that extends from the stud portion and is connected to the first front surface pads of the first group; and a redistribution structure disposed below the second semiconductor chip, where the redistribution structure includes redistribution layers that are electrically connected to the first and second semiconductor chips. The first front surface pads of the first group are electrically connected to the redistribution layers through the first bump structures.

According to an embodiment of the present inventive concept, a semiconductor package includes a first semiconductor chip that includes first pads of first and second groups; a chip structure that includes second upper pads disposed below the first semiconductor chip and that are electrically connected to the first pads of the second group, and second lower pads of first and second groups located opposite to the second upper pads; first bump structures that include a stud portion disposed below the second lower pads of the first group, and a bonding wire portion that extends from the stud portion and is connected to the first pads of the first group; second bump structures disposed below the second lower pads of the second group; and a redistribution structure disposed below the chip structure, where the redistribution structure includes redistribution layers that are electrically connected to the first and second bump structures.

According to an embodiment of the present inventive concept, a method of manufacturing a semiconductor package, includes forming a first semiconductor wafer that includes a first front surface and a first rear surface that are opposite to each other, and first front surface pads of first and second groups that are disposed on the first front surface; forming at least one second semiconductor chip that includes a second front surface and a second rear surface that are opposite to each other, second rear surface pads of first and second groups that are disposed on the second rear surface, and conductive posts that are disposed on the second rear surface pads of the second group; attaching the at least one second semiconductor chip onto the first semiconductor wafer such that the second front surface faces the first front surface; forming a bonding wire that electrically connects the first front surface pads of the first group and the second rear surface pads of the first group, and forming a stud bump on the second rear surface pads of the first group; forming a preliminary encapsulant that encapsulates the at least one second semiconductor chip, the bonding wire, and the stud bump, on the first semiconductor wafer; performing a polishing process that forms an encapsulant from which a portion of the preliminary encapsulant is removed, forms first bump structures that includes a stud portion from which a portion of the stud bump is removed, and forms second bump structures from which a portion of the conductive posts is removed, where the first and second bump structures are exposed through an upper surface of the encapsulant; and forming a redistribution structure on the upper surface of the encapsulant, where the redistribution structure comprises redistribution layers that are electrically connected to the first bump structures or the second bump structures.

DETAILED DESCRIPTION

Hereinafter, embodiments of the present inventive concept will be described with reference to the accompanying drawings.

Figure 1A:
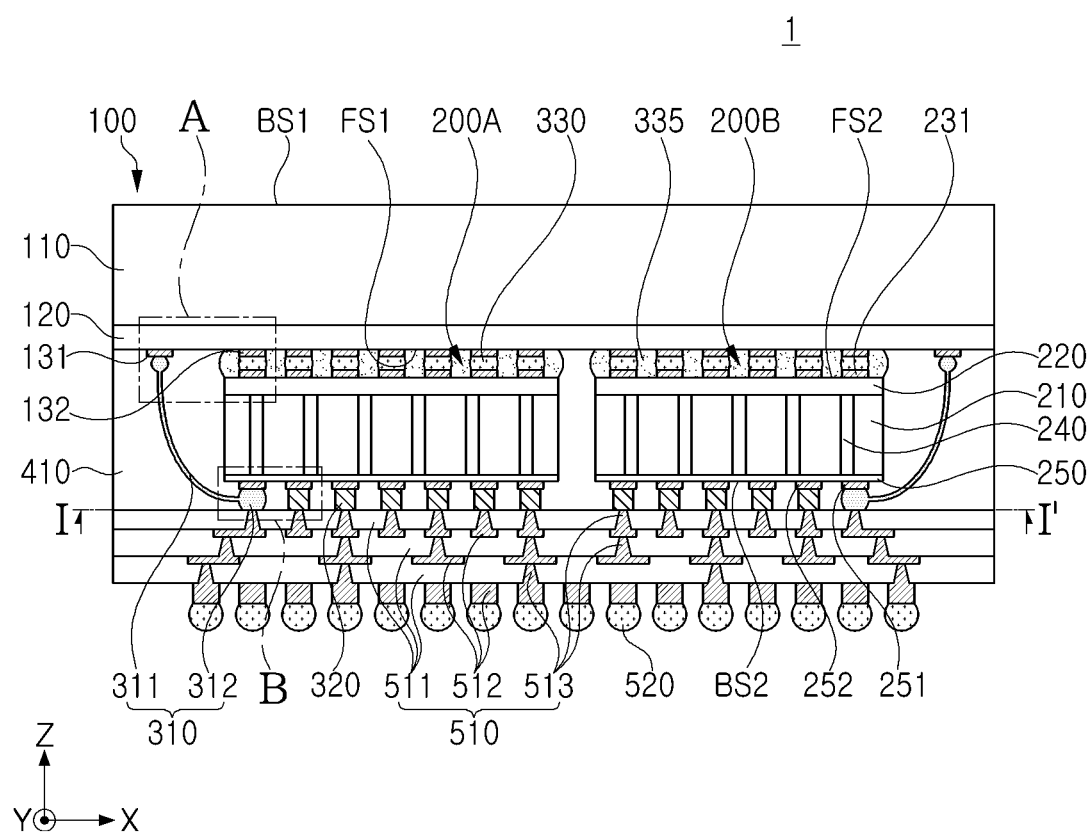
FIG. 1A is a cross-sectional view of a semiconductor package according to an embodiment of the present inventive concept.
Figure 1B:
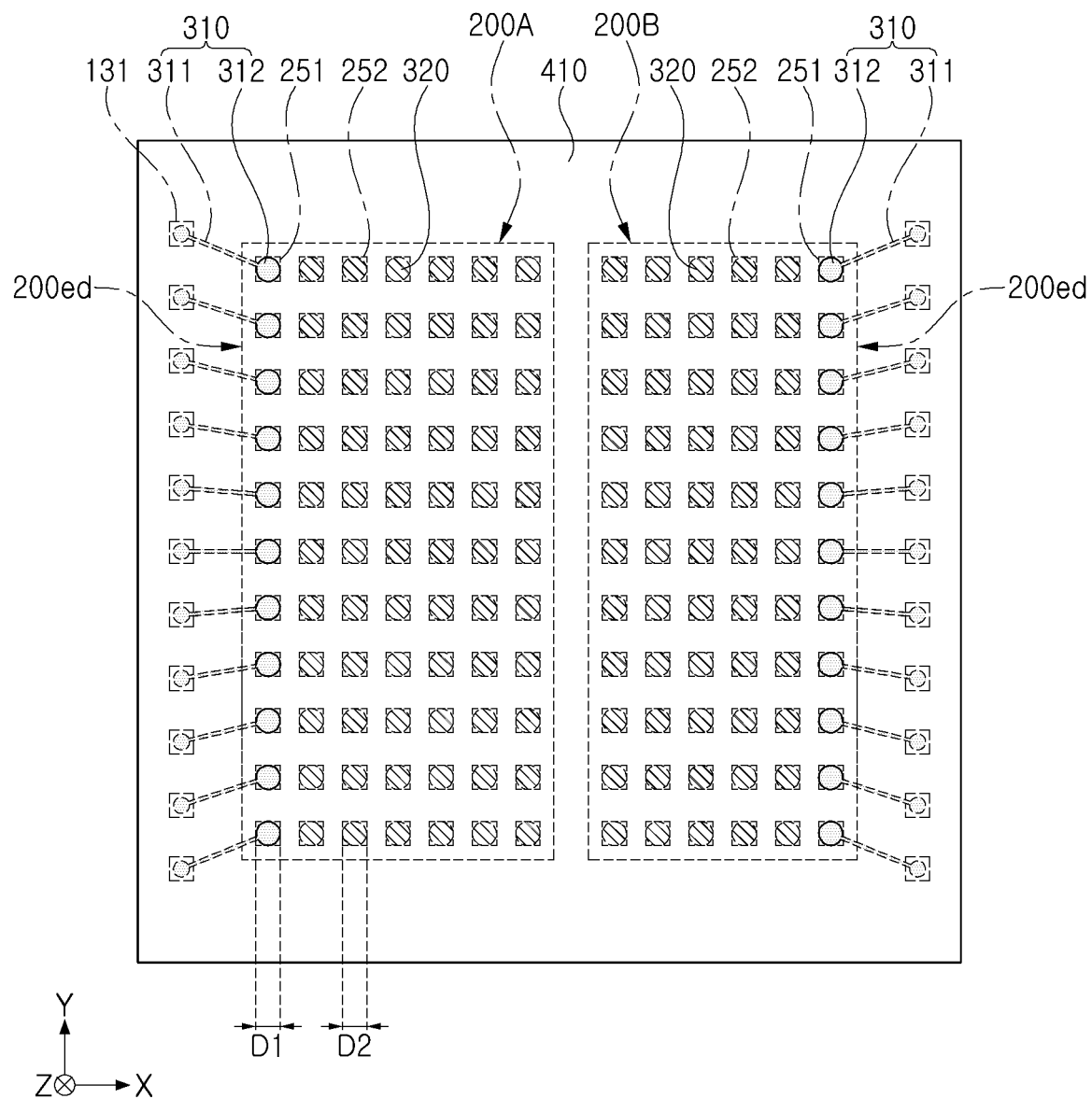
FIG. 1B is a plan view of FIG. 1A, taken along line I-I'.
Figure 1C:
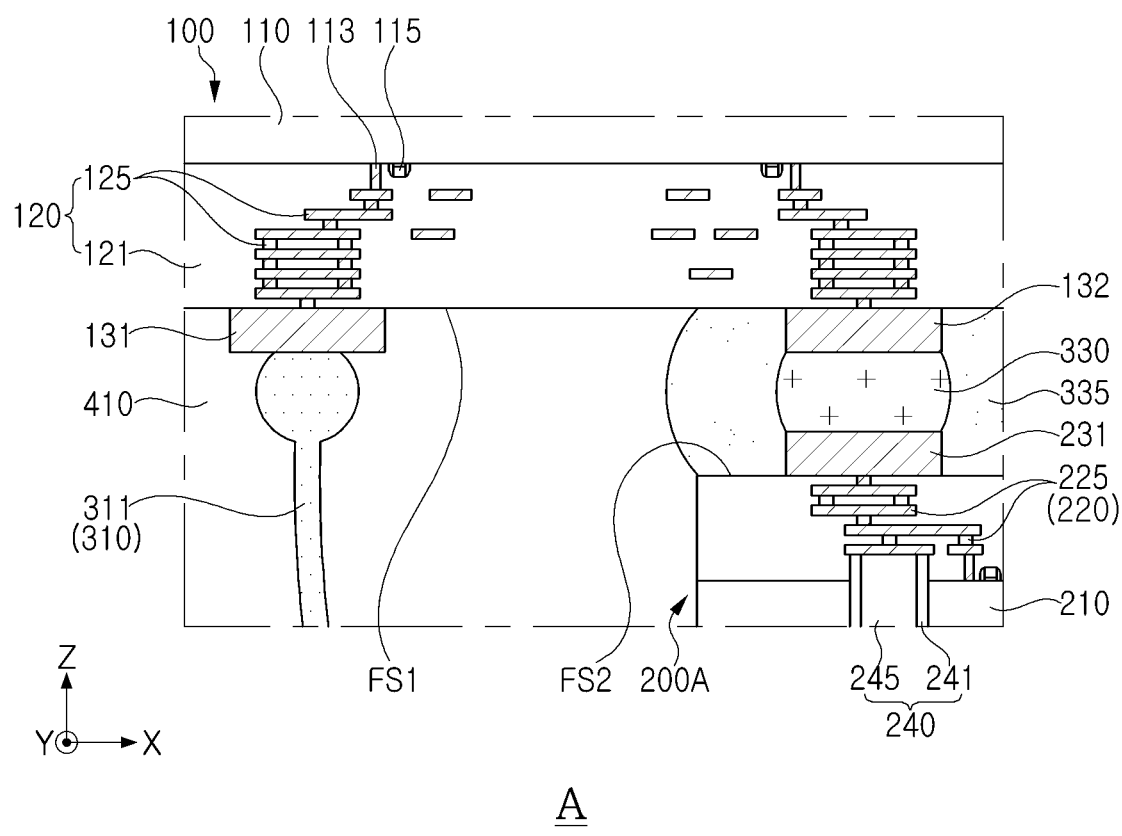
FIG. 1C is a partially enlarged view of portion 'A' of FIG. 1A.

FIG. 1A is a cross-sectional view of a semiconductor package 1 according to an embodiment of the present inventive concept, FIG. 1B is a plan view of FIG. 1A, taken along line I-I', and FIG. 1C is a partially enlarged view of portion 'A' of FIG. 1A.

Referring to FIGS. 1A to 1C, a semiconductor package 1 according to an embodiment includes a first semiconductor chip 100, at least one second semiconductor chip 200A or 200B, first and second bump structures 310 and 320, an encapsulant 410, and a redistribution structure 510. According to an embodiment of the present inventive concept, the first semiconductor chip 100 has a first width, the at least one second semiconductor chip 200A or 200B has a second width, narrower than the first width, and the redistribution structure 510 is stacked in a vertical or thickness direction (a Z-axis direction), and the first semiconductor chip 100 and the redistribution structure 510 are connected using a bonding wire and a stud bump to reduce process challenges and manufacturing cost. When a metal post is formed between the first semiconductor chip 100 and the redistribution structure 510, a yield may decrease, and a manufacturing cost may increase. For example, since forming a metal post to a certain height, such as 100 μm, or more is challenging, and the possibility of generating defects, such as misalignment increases in a high-temperature process, such as about 300° C. or higher, due to deformation of the metal post, when the first semiconductor chip 100 and the redistribution structure 510 are connected using a metal post, a manufacturing cost may increase and a yield may decrease. In an embodiment of the present inventive concept, by introducing the first bump structure 310 that replaces the metal post, a connection state between the first semiconductor chip 100 and the redistribution structure 510 can be stably maintained and a yield can be increased even in a high-temperature process.

Hereinafter, each component of the semiconductor package 1 according to an embodiment will be described.

The first semiconductor chip 100 includes a first rear surface BS1 and a first front surface FS1, opposite to each other, and further includes a first substrate 110, a first circuit layer 120, and first connection pads 131 and 132. Although the drawings show that the first front surface FS1 is provided by the first circuit layer 120, embodiments are not necessarily limited thereto, and in an embodiment, the first front surface FS1 may be provided by a separate insulating material layer stacked below the first circuit layer 120, such as an embodiment shown in FIG. 4A.

The first substrate 110 is a semiconductor wafer that may include a semiconductor element such as silicon or germanium, or a compound semiconductor such as silicon carbide (SiC), gallium arsenide (GaAs), indium arsenide (InAs), or indium phosphide (InP). The first substrate 110 includes an active surface, such as a surface that faces the first circuit layer 120, that includes an active region doped with impurities, and an inactive surface opposite to the active surface. Although FIG. 1A shows an upper surface of the first substrate 110 as being the first rear surface BS1 of the first semiconductor chip 100, embodiments are not necessarily limited thereto, an in an embodiment, a protective layer that provides the first rear surface BS1 of the first semiconductor chip 100 is formed on the first substrate 110. The protective layer is made of an insulating material such as silicon oxide, silicon nitride, or silicon oxynitride, but, according to an embodiment, is also made of an insulating polymer.

The first circuit layer 120 is disposed on a lower surface of the first substrate 110, and includes an interlayer insulating layer 121 and a wiring structure 125. The interlayer insulating layer 121 includes at least one of flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), or flowable CVD (FCVD) oxide, or a combination thereof. At least a portion of the interlayer insulating layer 121 that surrounds the wiring structure 125 is a low dielectric layer. The interlayer insulating layer 121 may be formed using a chemical vapor deposition (CVD) process, a flowable-CVD process, or a spin coating process. The wiring structure 125 is a multi-layer structure that includes a via and a wiring pattern that includes, for example, one of aluminum (Al), gold (Au), cobalt (Co), copper (Cu), nickel (Ni), lead (Pb), tantalum (Ta), tellurium (Te), titanium (Ti), or tungsten (W), or a combination thereof. A barrier layer that includes titanium (Ti), titanium nitride (TiN), tantalum (Ta), or tantalum nitride (TaN) may be disposed between the wiring pattern and/or the via and the interlayer insulating layer 121. Individual devices 115 that constitute an integrated circuit are disposed on the lower surface of the first substrate 110, or an active surface thereof. The wiring structure 125 is electrically connected to the individual devices 115 by an interconnection portion 113, such as a contact plug. The individual devices 115 may include an FET such as a planar FET or a FinFET, a memory device such as a flash memory, a DRAM, an SRAM, an EEPROM, a PRAM, an MRAM, an FeRAM, or an RRAM, a logic device such as an AND, an OR, or a NOT, etc., or various active and/or passive components such as a system LSI, a CIS, or an MEMS.

The first connection pads 131 and 132 are disposed on the first front surface FS1 of the first semiconductor chip 100 and include first front surface pads 131 of a first group and first front surface pads 132 of a second group. Since having the first circuit layer 120 and a second circuit layer 220 face each other shortens a signal transmission path, although the first connection pads 131 and 132 are illustrated as front surface pads disposed below the first front surface FS1, embodiments of the present inventive concept are not necessarily limited thereto. According to an embodiment, the first semiconductor chip 100 is disposed such that the first rear surface BS1 faces the second semiconductor chips 200A and 200B, and the first connection pads 131 and 132 are rear surface pads disposed below the first rear surface BS1.

The first front surface pads 131 of the first group and the first front surface pads 132 of the second group are connection terminals that are each electrically connected to the wiring structure 125 of the first circuit layer 120. The first front surface pads 131 of the first group and the first front surface pads 132 of the second group include any one of copper (Cu), nickel (Ni), titanium (Ti), aluminum (Al), gold (Au), or silver (Ag), or an alloy thereof. The first front surface pads 131 of the first group do not overlap the second semiconductor chips 200A and 200B in (the Z-axis direction, perpendicular to the first front surface FS1. The first front surface pads 132 of the second group overlap the second semiconductor chips 200A and 200B in the Z-axis direction. For example, the first front surface pads 132 of the second group face second front surface pads 231 of the second semiconductor chips 200A and 200B, and are electrically connected to the second front surface pads 231 through a separate electrical connection member, such as a conductive bump, or may be in direct contact with and connected to the second front surface pads 231, as shown in an embodiment of FIG. 4A. The first front surface pads 131 of the first group are electrically connected through a first bump structure 310 to portions of second rear surface pads, hereinafter, second rear surface pads 251 of a first group, located on a lower level from the second front surface pads 231. The first bump structure 310 includes a stud portion 312 and a bonding wire portion 311.

The second semiconductor chip 200A or 200B has a second rear surface BS2 and a second front surface FS2, opposite to each other, and includes a second substrate 210, a second circuit layer 220, second front surface pads 231, a through-electrode 240, a second wiring layer 250, and second rear surface pads 251 and 252. The second semiconductor chips 200A and 200B are horizontally separated and disposed below the first semiconductor chip 100. According to an embodiment, the number of second semiconductor chips may be less than or greater than those illustrated in the drawings. In addition, according to an embodiment, a plurality of second semiconductor chips that are stacked in the Z-axis direction are disposed below the first semiconductor chip 100, as shown in an embodiment of FIG. 5. For example, in an embodiment, the first semiconductor chip 100 and the second semiconductor chips 200A and 200B are a chiplet that constitutes a multi-chip module (MCM). For example, in an embodiment, the first semiconductor chip 100 and the second semiconductor chips 200A and 200B may include a central processing unit (CPU), a graphics processing unit (GPU), a field programmable gate array (FPGA), an I/O chip, or a memory chip such as a DRAM, an SRAM, a PRAM, an MRAM, an FeRAM, or an RRAM, or the like, respectively. The second substrate 210 and the second circuit layer 220 have the same or similar characteristics as the first substrate 110 and the first circuit layer 120 described above, components corresponding to each other may be denoted by similar reference numerals, and repeated descriptions thereof may be omitted. Although the drawings show the second circuit layer 220 of the second semiconductor chips 200A and 200B as facing the first semiconductor chip 100, embodiments are not necessarily limited thereto, and in an embodiment, the second wiring layer 250 faces the first semiconductor chip 100.

Figure 4A:
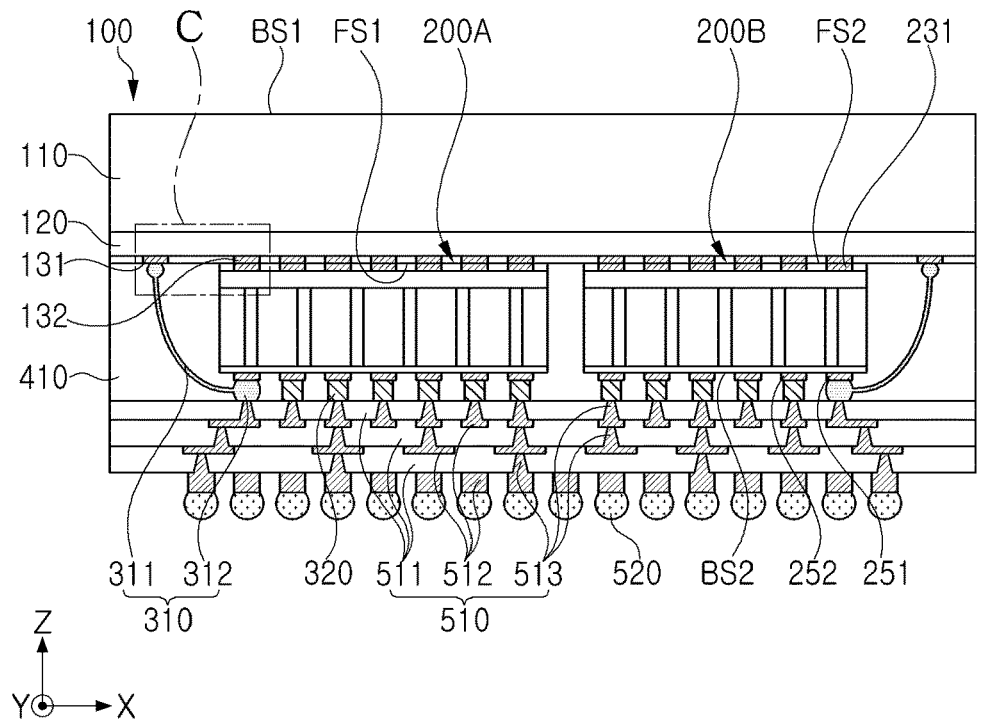
FIG. 4A is a cross-sectional view of a semiconductor package according to an embodiment of the present inventive concept.

The second front surface pads 231 are connection terminals disposed on the second front surface FS2 that faces the first front surface FS1 of the first semiconductor chip 100, and are electrically connected to a second wiring structure 225 of the second circuit layer 220. Although the drawings show the second front surface pads 231 as being disposed on the second front surface FS2, embodiments are not necessarily limited thereto, and in an embodiment, the second front surface pads 231 provide the flat second front surface FS2, together with the insulating material layer on the second circuit layer 220, as shown in FIG. 4A.

The second front surface pads 231 are electrically connected to first front surface pads 132 of the second group, which face each other, through third bump structures 330. The third bump structures 330 are disposed between the first front surface FS1 of the first semiconductor chip 100 and the second front surface FS2 of the second semiconductor chips 200A and 200B. In addition, an adhesive film 335 that surrounds the third bump structures 330 is interposed between the first front surface FS1 of the first semiconductor chip 100 and the second front surfaces FS2 of the second semiconductor chips 200A and 200B. The third bump structure 330 may be a solder ball, or may be a structure in which a conductive post and a solder ball are combined. The adhesive film 335 may be a non-conductive film (NCF), but is not necessarily limited thereto, and may include, for example, one of various types of polymer films that can survive a thermal compression process.

The second front surface pads 231 are electrically connected to at least a portion of the second rear surface pads 251 and 252 through the through-electrode 240. The through-electrode 240 penetrates through the second substrate 210 and electrically connects the second front surface pads 231 to at least a portion of the second rear surface pads 251 and 252, located opposite thereto. The through-electrode 240 includes a via plug 245 and a side insulating layer 241 that surrounds the side surfaces of the via plug 245. The side insulating layer 241 electrically separates the via plug 245 from the second substrate 210. The via plug 245 includes, for example, at least one of tungsten (W), titanium (Ti), aluminum (Al), or copper (Cu), and may be formed by a plating process, a PVD process, or a CVD process. The side insulating layer 241 includes a metal compound such as tungsten nitride (WN), titanium nitride (TiN), or tantalum nitride (TaN), and may be formed by a PVD process or a CVD process.

The second wiring layer 250 is disposed on a lower surface of the second substrate 210 and provides the second rear surface BS2. The second wiring layer 250 includes a rear surface interlayer insulating layer 253, shown in FIG. 2A, and a rear surface wiring structure 255, also shown in FIG. 2A. This has the same or similar characteristics to the interlayer insulating layer 121 and the wiring structure 125 of the first circuit layer 120 described above, and a repeated description thereof may be omitted.

The second rear surface pads 251 and 252 include second rear surface pads 251 of a first group and second rear surface pads 252 of a second group that are disposed on the second rear surface BS2. The second rear surface pads 251 of the first group are disposed adjacent to an edge 200ed, shown in FIG. 1B, of the second semiconductor chips 200A and 200B, and are electrically isolated from the second rear surface pads 252 of the second group. The second rear surface pads 251 of the first group are electrically connected to redistribution layers 512 of the redistribution structure 510 through the first bump structure 310. The second rear surface pads 252 of the second group are electrically connected to the redistribution layers 512 of the redistribution structure 510 through the second bump structures 320. According to an embodiment of the present inventive concept, the stud portion 312 is formed on the second rear surface pads 251 of the first group, and the stud portion 312 is connected to a redistribution via 513 of the redistribution structure 510, that shortens a signal transmission distance between the first semiconductor chip 100 and the redistribution layers 512. For example, the signal of the first semiconductor chip 100 that reaches the stud portion 312 through the bonding wire portion 311 is transmitted to an external connection terminal 520 through the redistribution layer 512, without going through the rear surface wiring structure 255, shown in FIG. 5A, of the second wiring layer 250 and the second bump structure 320.

The first bump structures 310 includes a stud portion 312 disposed below the second rear surface pads 251 of the first group, and a bonding wire portion 311 that extends from the stud portion 312 and is connected to the first front surface pads 131 of the first group. The stud portion 312 and the bonding wire portion 311 may be integrally formed, and may be made of the same material. The stud portion 312 and the bonding wire portion 311 include at least one of gold (Au), silver (Ag), lead (Pb), aluminum (Al), or copper (Cu), or an alloy thereof, but embodiments of the present inventive concept are not necessarily limited thereto. The stud portion 312 includes an exposed surface that is not covered by the encapsulant 410 and that contacts the redistribution via 513. For example, the stud portion 312 includes a lower surface 310BS, shown in FIG. 2A, or an exposed surface that is exposed through the encapsulant 410. A diameter 'D1, shown in FIG. 1B, of the exposed or lower surface of the stud portion 312 is substantially equal to a diameter D2, shown in FIG. 1B, of an exposed or lower surface of the second bump structure 320 exposed through the encapsulant 410. In this case, "substantially equal" means that a diameter is not intentionally designed differently and that a process error may have occurred. The diameter D1 of the exposed or lower surface of the stud portion 312 is about 20 μm or more or about 30 μm or more. For example, the diameter D1 of the exposed or lower surface of the stud portion 312 may range from about 20 μm to about 80 μm, from about 30 μm to about 70 μm, or from about 40 μm to about 60 μm, etc., When the diameter D1 of the exposed or lower surface of the stud portion 312 is less than about 20 μm, forming the redistribution via 513 may be challenging. The diameter D1 of the exposed or lower surface of the stud portion 312 is determined according to a condition of process, such as photolithography process, that forms the redistribution via 513, and is not necessarily limited to the above-mentioned numerical values.

The second bump structures 320 are disposed below the second rear surface pads 252 of the second group, and are directly connected to the redistribution via 513. The second bump structures 320 include a different type of metal from the first bump structures 310. For example, the second bump structures 320 include copper (Cu) or an alloy of copper (Cu), but embodiments of the present inventive concept are not necessarily limited thereto. A shape of the second bump structures 320 differs from that of the first bump structures 310, which will be described below with reference to FIG. 2A.

The encapsulant 410 is disposed below the first semiconductor chip 100, and encapsulates the second semiconductor chips 200A and 200B, and the first and second bump structures 310 and 320. The encapsulant 410 surrounds a side surface of the stud portion 312 of the first bump structures 310 and side surfaces of the second bump structures 320, and a lower surface of the encapsulant 410 is coplanar with a lower surface of the stud portion 312 and lower surfaces of the second bump structures 320. The encapsulant 410 includes, for example, a thermosetting resin such as an epoxy resin, a thermoplastic resin such as polyimide, or a prepreg that includes an inorganic filler and/or glass fiber, ABF, FR-4, BT, or EMC, etc.

The redistribution structure 510 is disposed below the encapsulant 410 and the second semiconductor chips 200A and 200B, and includes an insulating layer 511, redistribution layers 512, and redistribution vias 513. The insulating layer 511 includes an insulating resin. The insulating resin includes at least one of a thermosetting resin such as an epoxy resin, a thermoplastic resin such as polyimide, or a resin impregnated with inorganic fillers and/or glass fibers in these resins, such as prepreg, ABF, FR-4, BT, or a photo-sensitive resin such as a photo-imageable dielectric (PID). The insulating layer 511 may include a plurality of insulating layers 511 stacked in a vertical direction. Depending on a process, a boundary between the plurality of insulating layers 511 may be unclear.

The redistribution layers 512 are disposed below the insulating layer 511, and are electrically connected to the first semiconductor chip 100 and the second semiconductor chips 200A and 200B. The redistribution layers 512 include, for example, a metal that includes at least one of copper (Cu), aluminum (Al), silver (Ag), tin (Sn), gold (Au), nickel (Ni), lead (Pb), or titanium (Ti), or an alloy thereof. The redistribution layers 512 include, for example, a ground pattern, a power pattern, and a signal pattern. For example, the lowermost layers of redistribution layers 512 are thicker than redistribution layers 512 disposed thereon to form a reliable connection with an external connection terminal 520. The external connection terminal 520 includes a low-melting-point metal, such as tin (Sn), indium (In), bismuth (Bi), antimony (Sb), copper (Cu), silver (Ag), zinc (Zn), or lead (Pb), or an alloy containing them, such as Sn—Ag—Cu, etc., and may have a spherical or ball-like shape.

The redistribution vias 513 penetrate through the insulating layer 511 and electrically connect the redistribution layers 512 to the first bump structure 310 or the second bump structure 320. In particular, at least a portion of the redistribution vias 513 connected to the first bump structure 310 is in direct contact with the stud portion 312. Therefore, a connection path between the first front surface pads 131 of the first group and the redistribution layer 512 is minimized. The redistribution vias 513 include a metal similar to that of the redistribution layers 512. The redistribution vias 513 have a filled via shape into which a metal is filled or a conformal via shape into which a metal material is formed along an inner wall of a via hole. The redistribution vias 513 may be integrally formed with the redistribution layers 512, but embodiments of the present inventive concept are not necessarily limited thereto.

Hereinafter, structures of the first bump structures 310 and the second bump structures 320 will be described in more detail with reference to FIGS. 2A and 2B.

Figure 2A:
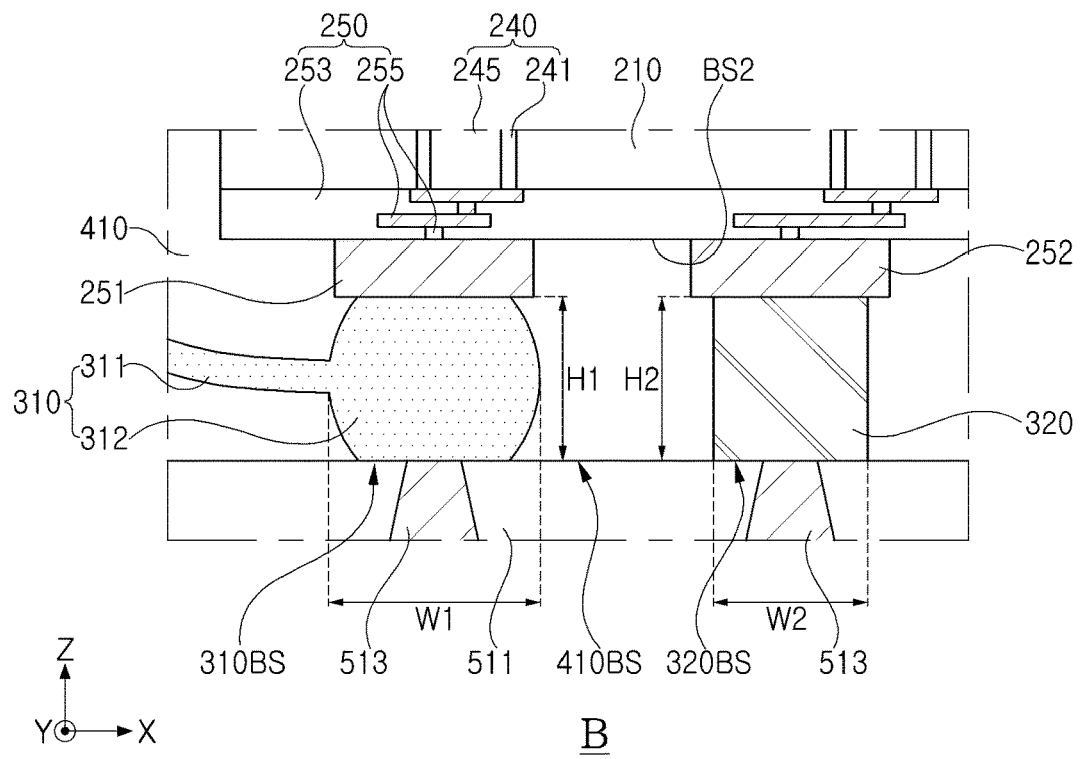
FIG. 2A is a partially enlarged view of portion 'B' of FIG. 1A.
Figure 2B:
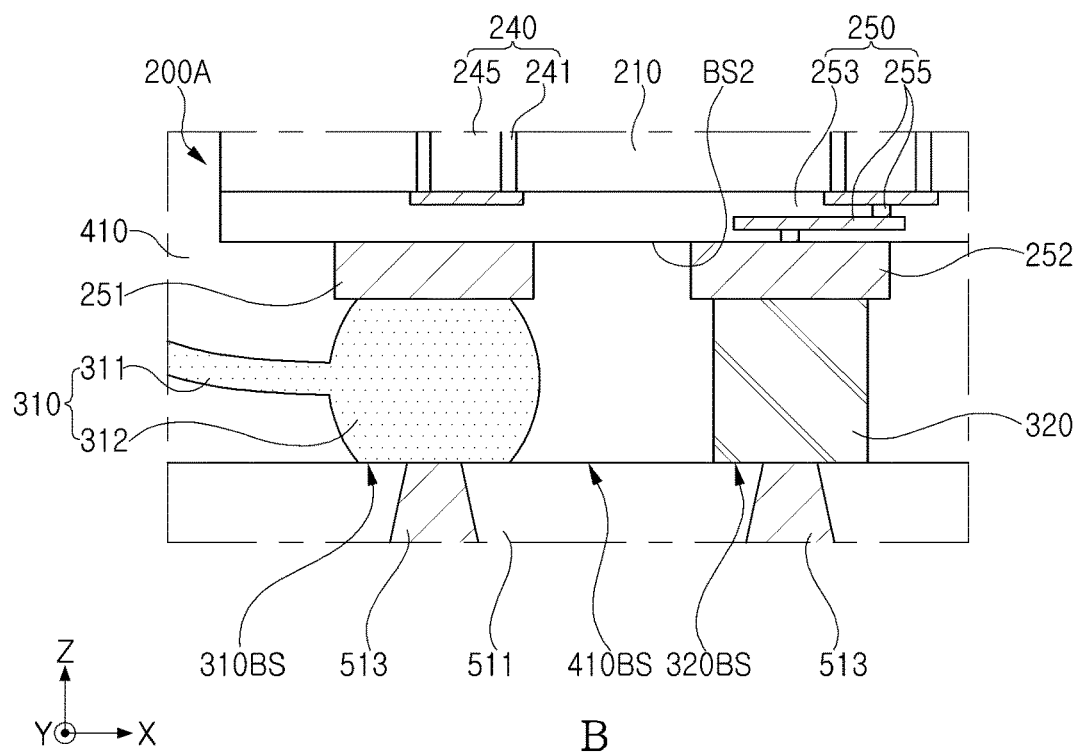
FIG. 2B is a partially enlarged view illustrating a modified example of portion 'B' of FIG. 1A.

FIG. 2A is a partially enlarged view of portion 'B' of FIG. 1A, and FIG. 2B is a partially enlarged view of a modified example of portion 'B' of FIG. 1A.

Referring to FIG. 2A, in a semiconductor package 1 according to an embodiment, the stud portions 312 of the first bump structures 310 have a height H1 in a Z-axis direction perpendicular to the second rear surface BS2 that is substantially equal to a height H2 of the second bump structures 320. For example, the second rear surface pads 251 of the first group and the second rear surface pads 252 of the second group are formed in the same process and have substantially the same height, and the stud portion 312 and the second bump structures 320 respectively disposed therebelow are also formed by a polishing process, described with reference to FIG. 8C, to have substantially the same height. In addition, a lower surface 310BS of the stud portion 312, a lower surface 320BS of the second bump structures 320, and a lower surface 410BS of the encapsulant 410, formed by the polishing process, are substantially coplanar.

The first bump structures 310 and the second bump structures 320 are formed by different manufacturing processes. For example, the first bump structures 310 are integrally formed with the bonding wire portion 311 by a wire bonding process using a capillary 30, shown in FIG. 8B, and the second bump structures 320 are formed by a plating process that uses a photoresist. Therefore, the stud portion 312 of the first bump structures 310 has a post shape or a coin-shape, in which a side surface is convexly rounded in a horizontal direction, such as an X-direction, and the second bump structures 320 has a post shape with flat side surfaces, for example, surfaces that are not convexly rounded in a horizontal direction. For example, the second bump structures 320 include a conductive post. For example, the stud portion 312 have a maximum width W1 in a horizontal direction, such as the X-axis and Y-axis directions that are parallel to the second rear surface BS2, that is greater than a maximum width W2 of the second bump structures 320.

As described above, due to the stud portion 312 that is integrally formed with the bonding wire portion 311, an electrical path that connects the first front surface pads 131 of the first group of the first semiconductor chip 100 to the redistribution layers 512 or the redistribution vias 513 of the redistribution structure 510 can be secured without passing through a rear surface wiring structure 255 of the second semiconductor chips 200A and 200B. The second rear surface pads 251 of the first group on which the stud portion 312 is disposed are electrically connected to the through-electrode 240 through the rear surface wiring structure 255. Signals from the second semiconductor chips 200A and 200B can be transmitted to the redistribution layers 512 through the through-electrode 240 and the stud portion 312.

Referring to FIG. 2B, in an embodiment, in a semiconductor package 1a of a modified example, second rear surface pads 251 of a first group on which a stud portion 312 is disposed are electrically insulated from a rear surface wiring structure 255 and a through-electrode 240. Regardless of the second semiconductor chips 200A and 200B, an electrical path connected from first front surface pads 131 of a first group of a first semiconductor chip 100 to redistribution layers 512 or redistribution vias 513 of a redistribution structure 510 can be secured by the stud portion 312.

Figure 3:
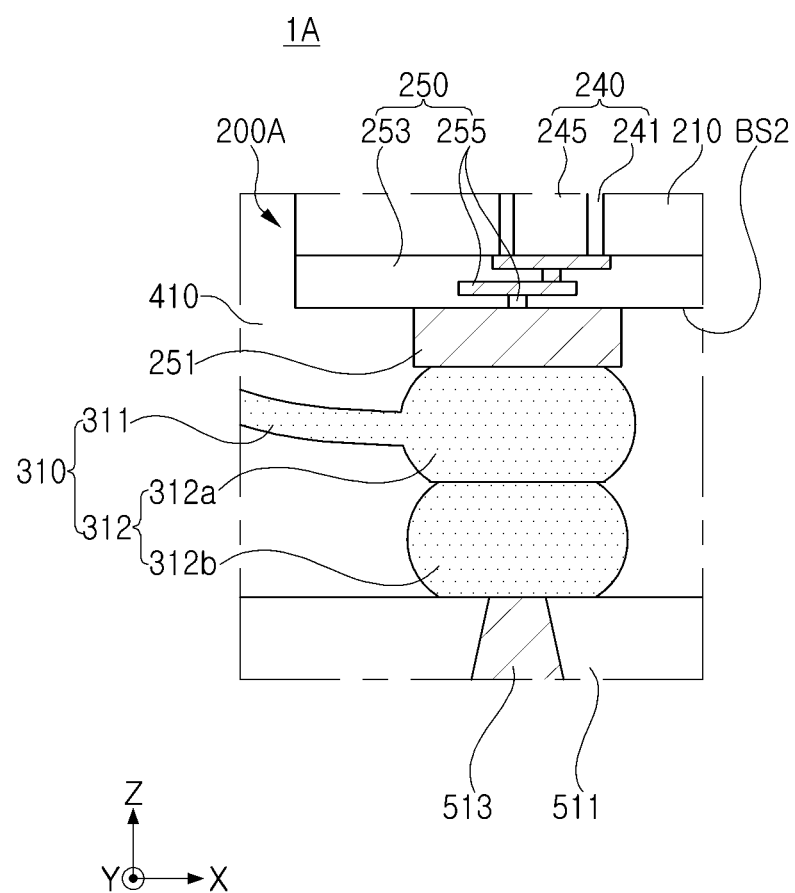
FIG. 3 is a partially enlarged view of a region of a semiconductor package according to an embodiment of the present inventive concept.

FIG. 3 is a partially enlarged view of a region of a semiconductor package 1A according to an embodiment of the present inventive concept. FIG. 3 illustrates a region in which a first bump structure 310 is illustrated, in portion 'B' of FIG. 1A.

Referring to FIG. 3, a semiconductor package 1A of an embodiment has the same or similar characteristics as those described with reference to FIGS. 1A to 2B, except that a stud portion 312 is formed of a plurality of stud layers. For example, first bump structures 310 according to a present embodiment includes a first stud layer 312a and a second stud layer 312b that are stacked between second rear surface pads 251 of a first group and redistribution vias 513. One of the first stud layer 312a or the second stud layer 312b is integrally formed with a bonding wire portion 311. The first stud layer 312a has a coined shape, and the second stud layer 312b has a coined shape, or may have a polished surface that faces the redistribution vias 513. The coin-shape is created, for example, by compressing a stud layer using a flat piece of silicon. The first stud layer 312a and the second stud layer 312b are separated by an interface therebetween. According to a present embodiment, since a contact area between the first stud layer 312a and the second rear surface pads 251 of the first group increases, connection reliability and structural stability of the stud portion 312 is secured. Depending on an embodiment, the stud portion 312 includes a greater number of stud layers than those illustrated in the drawings.

Figure 4B:
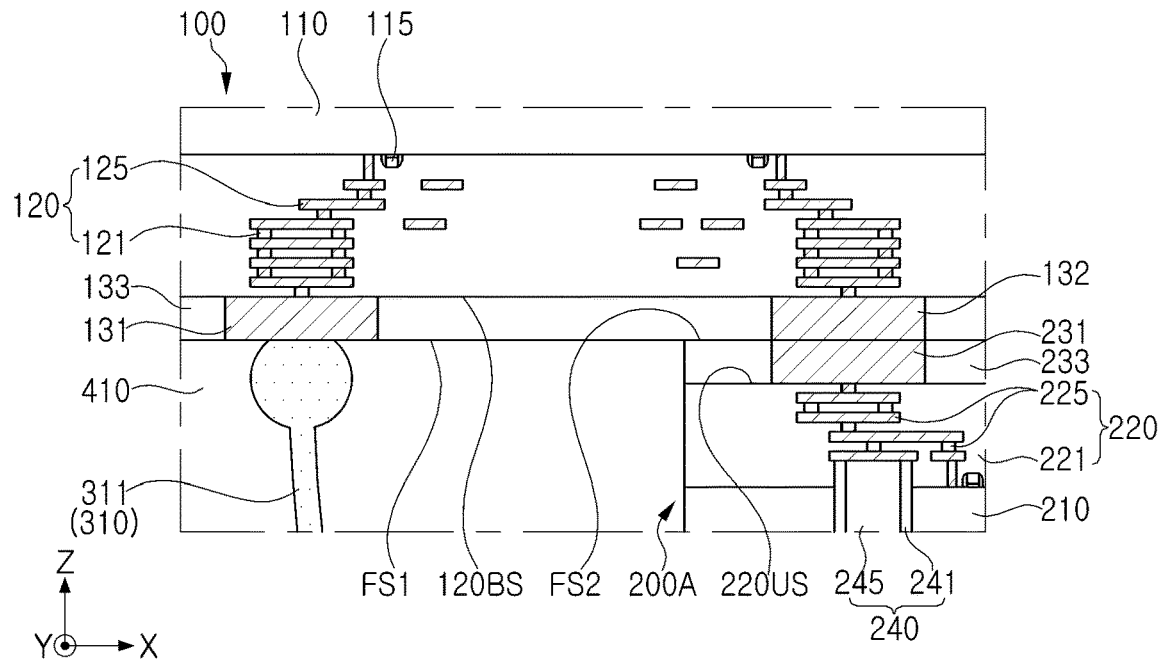
FIG. 4B is a partially enlarged view of portion 'C' of FIG. 4A.

FIG. 4A is a cross-sectional view of a semiconductor package 1B according to an embodiment of the present inventive concept, and FIG. 4B is a partially enlarged view of portion 'C' of FIG. 4A.

Referring to FIGS. 4A and 4B, a semiconductor package 1B according to an embodiment further includes a first insulating layer 133 that provides a first front surface FS1 of a first semiconductor chip 100, and a second insulating layer 233 that provides a second front surface FS2 of second semiconductor chips 200A and 200B. The first insulating layer 133 is disposed below a lower surface 120BS of a first circuit layer 120 and surrounds first front surface pads 131 and 132, and the second insulating layer 233 is disposed on an upper surface 220US of a second circuit layer 220 and surrounds second front surface pads 231. In a present embodiment, the first front surface FS1 is a flat surface provided by the first insulating layer 133 and the first front surface pads 131 and 132, and the second front surface FS2 is a flat surface provided by the second insulating layer 233 and the second front surface pads 231. The first front surface FS1 and the second front surface FS2 are in contact with and coupled to each other and form a so-called direct bonding or hybrid bonding structure. The semiconductor package 1B of a present embodiment has the same or similar characteristics as those described with reference to FIGS. 1A to 3, except that the first semiconductor chip 100 and the second semiconductor chips 200A and 200B are directly bonded to each other. The first insulating layer 133 and the second insulating layer 233 each include a material that can be bonded to the other, such as silicon oxide (SiO) or silicon carbonitride (SiCN). According to a present embodiment, a connection path between the first semiconductor chip 100 and the second semiconductor chip 200A and 200B is shortened, and a thickness of the semiconductor package 1B is reduced.

Figure 5:
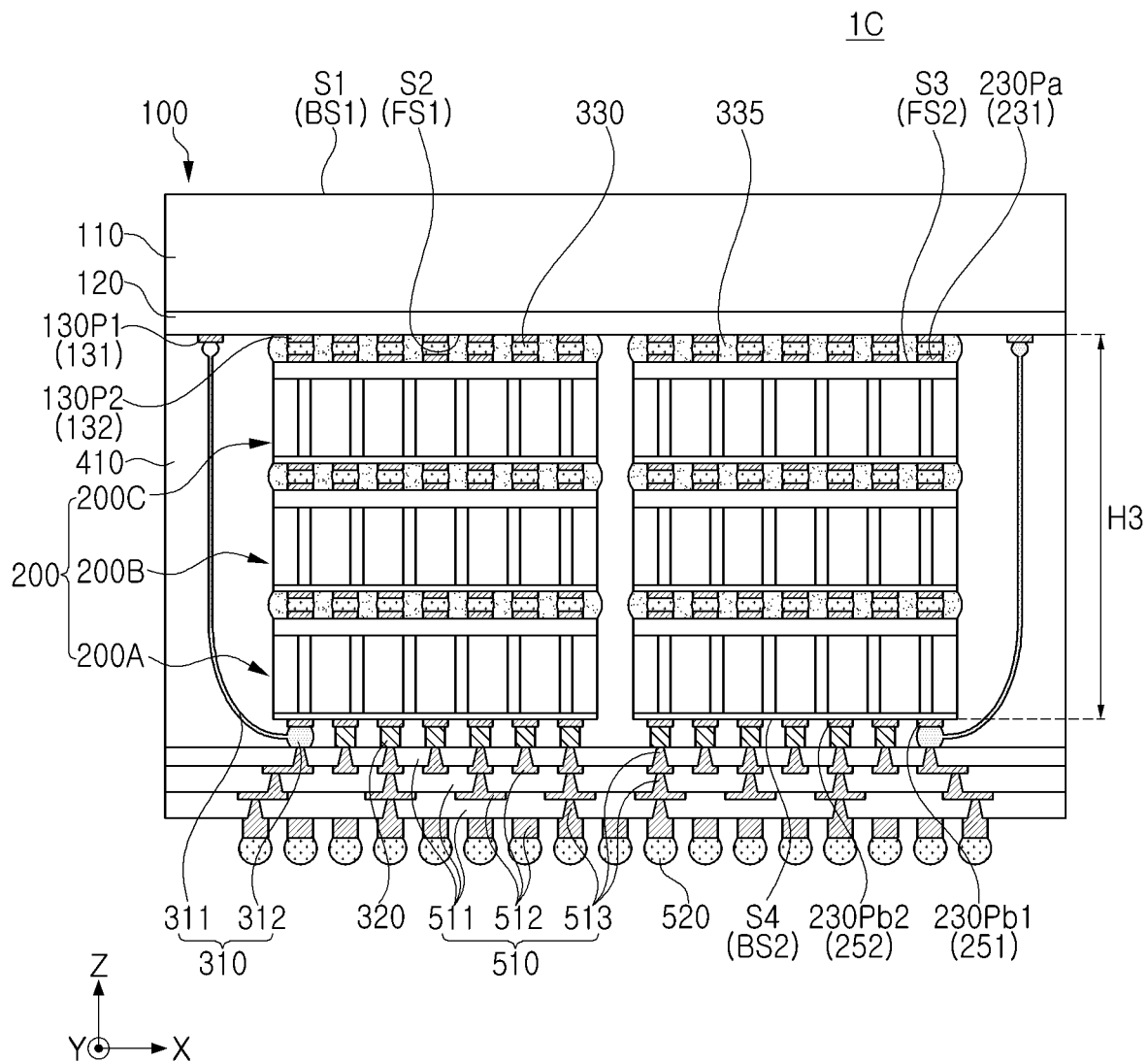
FIG. 5 is a cross-sectional view of a semiconductor package according to an embodiment of the present inventive concept.

FIG. 5 is a cross-sectional view of a semiconductor package 1C according to an embodiment of the present inventive concept.

Referring to FIG. 5, a semiconductor package 1C according to an embodiment has the same or similar characteristics as those described with reference to FIGS. 1A to 4B, except that the semiconductor package 1C includes at least one chip structure 200 disposed below a first semiconductor chip 100 that includes a plurality of second semiconductor chips 200A, 200B, and 200C. For example, the first semiconductor chip 100 may be a logic chip that includes at least one of a CPU, a GPU, an FPGA, an application process (AP), a digital signal processor (DSP), a cryptographic processor, a microprocessor, a microcontroller, an analog-to-digital converter, or an application-specific integrated circuit (ASIC), etc., and the plurality of second semiconductor chips 200A, 200B, and 200C may be memory chips such as a DRAM, an SRAM, a PRAM, an MRAM, an FeRAM, or an RRAM.

The first semiconductor chip 100 has a first surface S1 and a second surface S2 that are opposite to each other, and includes first pads 130P1 of a first group and first pads 130P2 of a second group disposed below the second surface S2.

The chip structure 200 has a third surface S3 and a fourth surface S4 that are opposite to each other, and includes second upper pads 230Pa disposed on the third surface S3 that faces the first semiconductor chip 100, and second lower pads 230Pb1 of a first group and second lower pads 230Pb2 of a second group that are disposed below the fourth surface S4 opposite to the second upper pads 230Pa.

The second upper pads 230Pa are electrically connected to the first pads 130P2 of the second group through a separate electrical connection member, such as a conductive bump, or are in direct contact with and connected to the first pads 130P2 of the second group, as shown in an embodiment of FIG. 4A.

The second lower pads 230Pb1 of the first group are electrically connected to the first pads 130P1 of the first group and redistribution vias 513 or redistribution layers 512 of a redistribution structure 510 through first bump structures 310. The second lower pads 230Pb2 of the second group are electrically connected to the redistribution vias 513 or redistribution layers 512 of the redistribution structure 510 through second bump structures 320.

The second upper pads 230Pa are provided by second front surface pads 231 of an uppermost second semiconductor chip 200C of the plurality of second semiconductor chips 200A, 200B, and 200C, and the second lower pads 230Pb1 of the first group and the second lower pads 230Pb2 of the second group are provided by second rear surfaces pads 251 and 252 of a lowermost second semiconductor chip 200A of the plurality of second semiconductor chips 200A, 200B, and 200C, respectively.

The chip structure 200 of a present embodiment has a height in a vertical direction at which a metal post that connects the first pads 130P1 of the first group and the redistribution layers 512 might not be formed. For example, a height from the first surface S1 to the second surface S2 of the first semiconductor chip 100 is less than a height from the third surface S3 to the fourth surface S4 of the chip structure 200. In addition, a height H3 from the second surface S2 of the first semiconductor chip 100 to the fourth surface S4 of the chip structure 200 is about 100 μm or more. For example, the height H3 from the second surface S2 to the fourth surface S4 may range from about 100 μm to about 1 mm, from about 200 μm to about 1 mm, from about 300 μm to about 1 mm, or from about 300 μm to about 900 μm. As described above, according to a present embodiment, an electrical connection path of about 100 μm or more can be formed using the first bump structures 310 to increase process reliability and yield.

Figure 6:
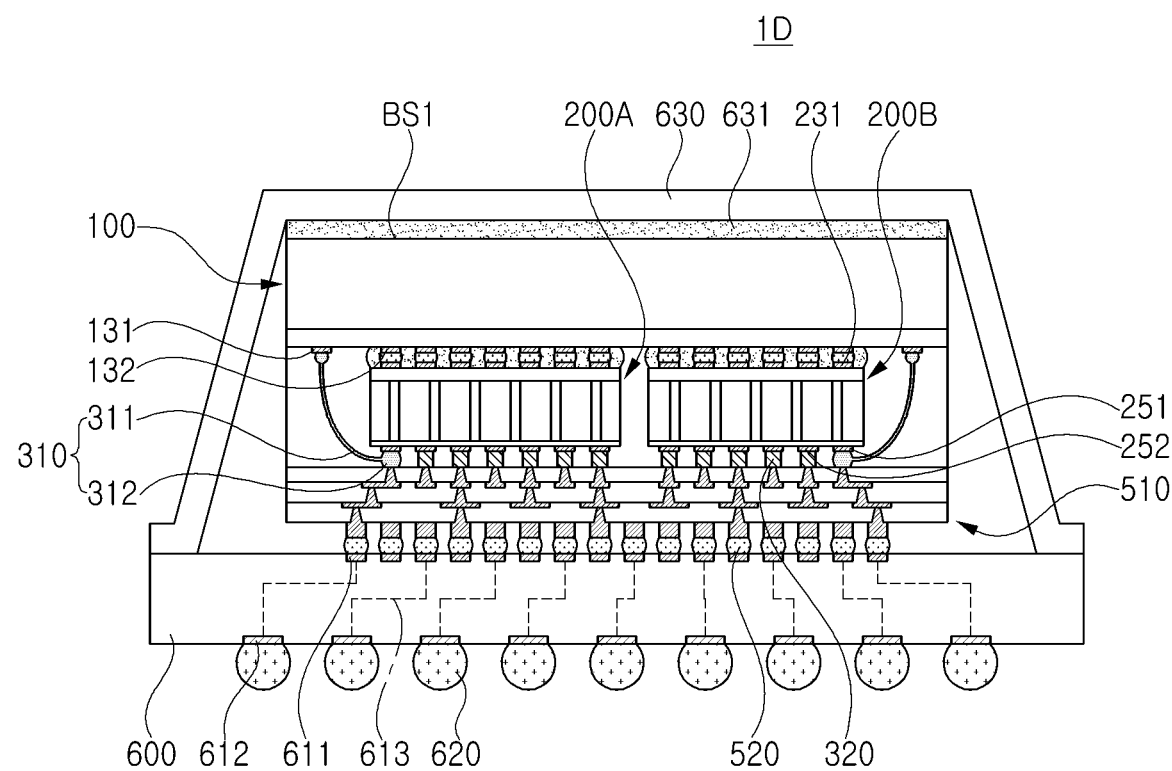
FIG. 6 is a cross-sectional view of a semiconductor package according to an embodiment of the present inventive concept.

FIG. 6 is a cross-sectional view of a semiconductor package 1D according to an embodiment of the present inventive concept.

Referring to FIG. 6, a semiconductor package 1D according to an embodiment has the same or similar characteristics as those described with reference to FIGS. 1A to 5, except that a wiring substrate 600 and a heat dissipation structure 630 are further included.

A wiring substrate 600 is a support substrate on which a package structure that includes a first semiconductor chip 100, second semiconductor chips 200A and 200B, a first bump structure 310, a second bump structure 320, a redistribution structure 510, etc., is mounted, and is a substrate for a semiconductor package such as a printed circuit board (PCB), a ceramic substrate, or a tape wiring substrate, etc. The wiring substrate 600 includes a lower pad 612 disposed on a lower surface of a body of the wiring substrate 600, an upper pad 611 disposed on an upper surface of the body, and a wiring circuit 613 that electrically connects the lower pad 612 and the upper pad 611. The body of the wiring substrate 600 may include different materials, depending on a type of the substrate. For example, when the wiring substrate 600 is a printed circuit board, the body may be a thin copper stack plate, or have a form in which a wiring layer is additionally stacked on one or both sides of a thin copper stack plate. The lower and upper pads 612 and 611 and the wiring circuit 613 form an electrical path that connects the lower surface and the upper surface of the wiring substrate 600. An external connection bump 620 connected to the lower pad 612 is disposed on the lower surface of the wiring substrate 600. The external connection bump 620 includes at least one of tin (Sn), indium (In), bismuth (Bi), antimony (Sb), copper (Cu), silver (Ag), zinc (Zn), or lead (Pb) and/or alloys thereof.

The heat dissipation structure 630 is disposed on an upper surface of the wiring substrate 600, and covers an upper portion of the first semiconductor chip 100. The heat dissipation structure 630 is attached to the wiring substrate 600 by an adhesive. The adhesive may be one of a thermally conductive adhesive tape, a thermally conductive grease, or a thermally conductive adhesive, etc. The heat dissipation structure 630 is in close contact with the first semiconductor chip 100 by an adhesive member 631 on the upper surface of the first semiconductor chip 100. The heat dissipation structure 630 includes a thermally conductive material. For example, the heat dissipation structure 630 includes a metal or a metal alloy that includes at least one of gold (Au), silver (Ag), copper (Cu), or iron (Fe), etc., or a conductive material such as graphite or graphene, etc. The heat dissipation structure 630 may have a shape that differs from that illustrated in the drawings. For example, the heat dissipation structure 630 may cover only the upper surface of the first semiconductor chip 100.

Figure 7A:
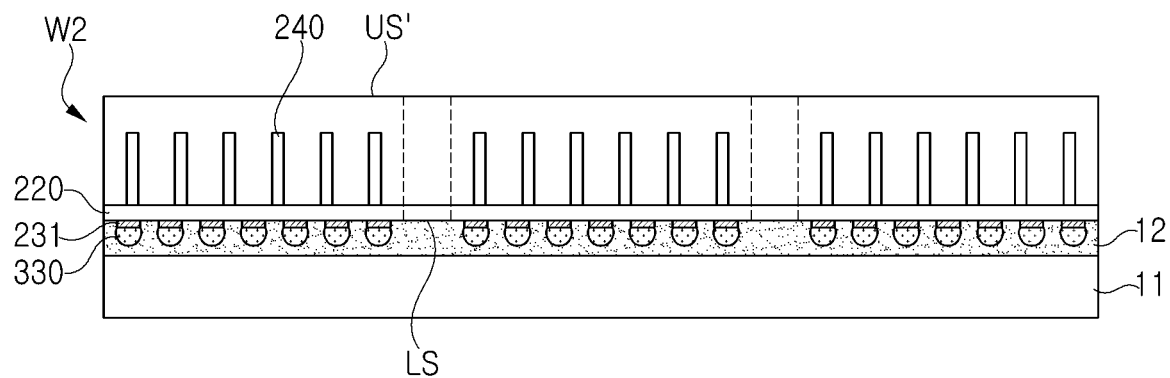
FIGS. 7A to 7C are cross-sectional views that schematically illustrate a process of manufacturing a second semiconductor chip of FIG. 1A.
Figure 7B:
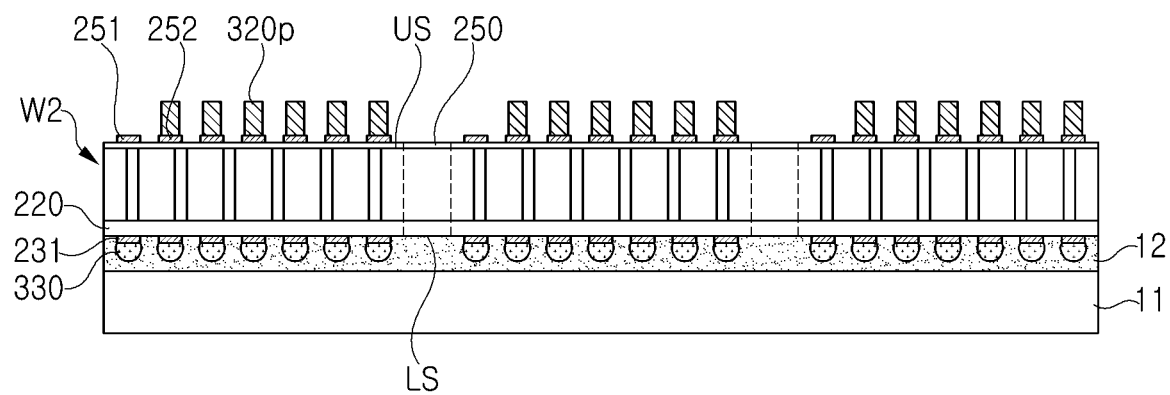
Figure 7C:
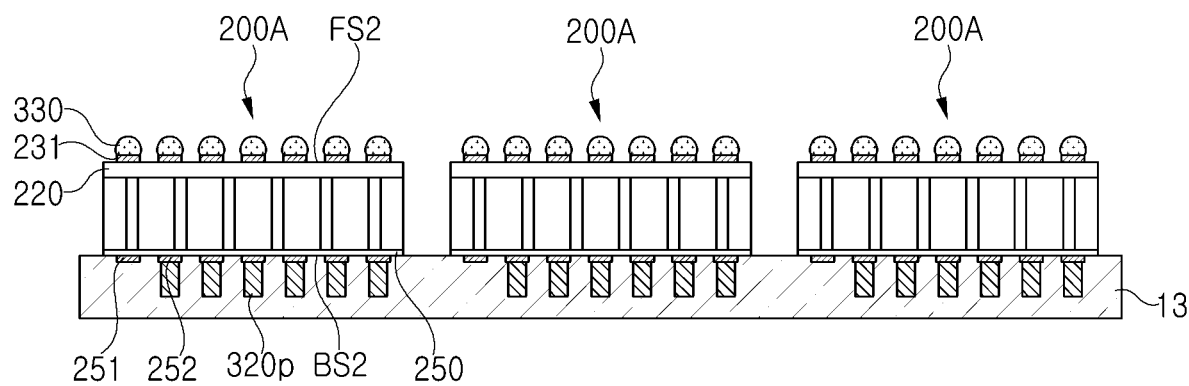

FIGS. 7A to 7C are cross-sectional views that schematically illustrate a process of manufacturing the second semiconductor chip 200A of FIG. 1A.

Referring to FIG. 7A, in an embodiment, a semiconductor wafer W2 from which a plurality of second semiconductor chips are formed, which may be referred to as a "second semiconductor wafer" is prepared that has an upper surface US' and a lower surface LS opposite to each other. The second semiconductor wafer W2 is temporarily bonded to a carrier substrate 11 using a bonding material layer 12. The bonding material layer 12 is made of an adhesive polymer material that can stably support the second semiconductor wafer W2 during a subsequent process. The second semiconductor wafer W2 is in a state in which some components of the second semiconductor chips are formed. For example, the second semiconductor wafer W2 includes a second circuit layer 220 disposed on one surface of a second substrate 210, second front surface pads 231 disposed below the second circuit layer 220, and through-electrodes 240 that extend through the second substrate 210. Expressions relating to directions such as "on,", "up," "upward," "below," "down," "downward," etc., are based on those illustrated in FIGS. 7A to 7C.)

Referring to FIG. 7B, in an embodiment, a second wiring layer 250, second rear surface pads 251 of a first group, and second rear surface pads 252 of a second group are formed on an upper surface US of the second semiconductor wafer W2 that has been planarized by a polishing process. As a portion of the second semiconductor wafer W2 is removed by a polishing process, upper ends of the through-electrodes 240 are exposed.

The polishing process may be one of a grinding process such as a chemical mechanical polishing (CMP) process, an etch-back process, or a combination thereof. For example, the grinding process is performed to reduce a thickness of the second semiconductor wafer W2 to a predetermined thickness, and the etch-back process having an appropriate condition is applied to expose the through-electrodes 240.

The second wiring layer 250 includes a rear surface interlayer insulating layer 253, shown in FIG. 2A, and a rear surface wiring structure 255, also shown in FIG. 2A. The rear surface interlayer insulating layer 253 may be formed using a chemical vapor deposition (CVD) process, a flowable-CVD process, or a spin coating process. The rear surface wiring structure 255 may be formed using an etching process or a plating process, etc.

The second rear surface pads 251 of the first group and the second rear surface pads 252 of the second group may be formed using a photolithography process or a plating process, etc. Conductive posts 320$p$ are formed on the second rear surface pads 252 of the second group. The conductive posts 320$p$ are formed by a photoresist pattern on the second circuit layer 220 that has an etched region that exposes the second rear surface pads 252 of the second group, and by a plating process that fills the etched region of the photoresist with a metal such as copper (Cu) or the like.

Referring to FIG. 7C, in an embodiment, the second semiconductor wafer W2 of FIG. 7B is supported on a dicing tape 13 and is cut and separated into a plurality of second semiconductor chips 200A. The second semiconductor wafer W2 may be separated using, for example, a laser dicing process., The plurality of second semiconductor chips 200A are respectively attached to a first semiconductor chip 100 of a first semiconductor wafer W1, shown in FIG. 8A, using a pick-and-place device.

FIGS. 8A to 8D are cross-sectional views that schematically illustrate a process of manufacturing the semiconductor package 1 of FIG. 1A.

Figure 8A:
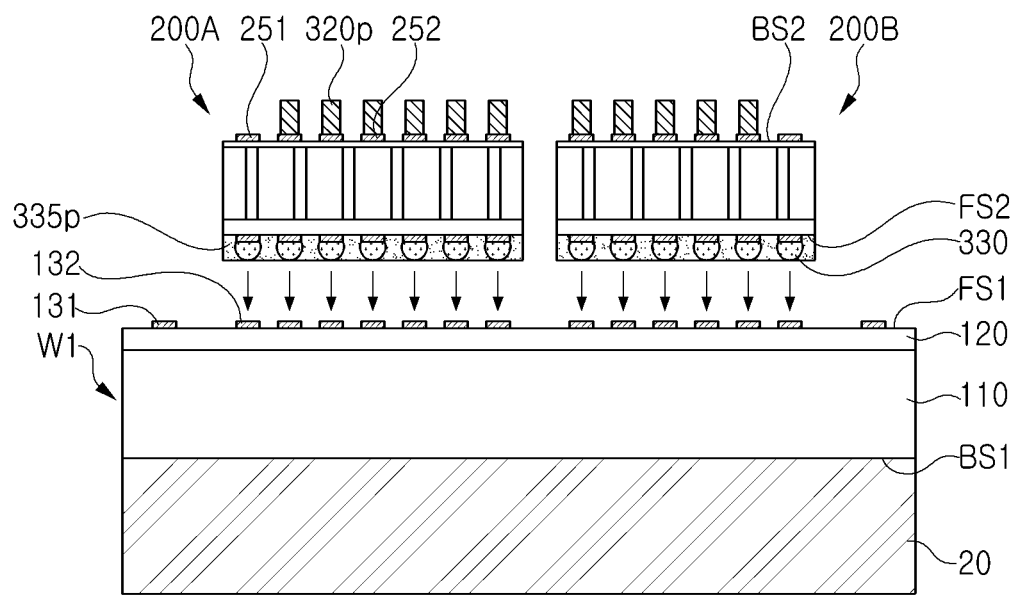
FIGS. 8A to 8D are cross-sectional views that schematically illustrate a process of manufacturing a semiconductor package of FIG. 1A.

Referring to FIG. 8A, in an embodiment, a first semiconductor wafer W1 is prepared that includes a first front surface FS1 and a first rear surface BS1 that are opposite to each other, and first front surface pads 131 of a first group and first front surface pads 132 of a second group that are disposed on the first front surface FS1. The first semiconductor wafer W1 is supported by a second carrier substrate 20.

In addition, at least one second semiconductor chip 200A or 200B prepared by the manufacturing process of FIGS. 7A to 7C. The at least one second semiconductor chip 200A or 200B includes a second front surface FS2 and a second rear surface BS2 that are opposite to each other, second rear surface pads 251 of a first group and second rear surface pads 252 of a second group that are disposed on the second rear surface BS2, and conductive posts 320$p$ disposed on the second rear surface pads 252 of the second group.

The at least one second semiconductor chip 200A or 200B is attached onto the first semiconductor wafer W1 such that the second front surface FS2 faces the first front surface FS1. A preliminary adhesive film layer 335$p$ that surrounding third bump structures 330 is disposed below the second front surface FS2 of the at least one second semiconductor chip 200A or 200B. The preliminary adhesive film layer 335$p$ is a non-conductive film (NCF).

Figure 8B:
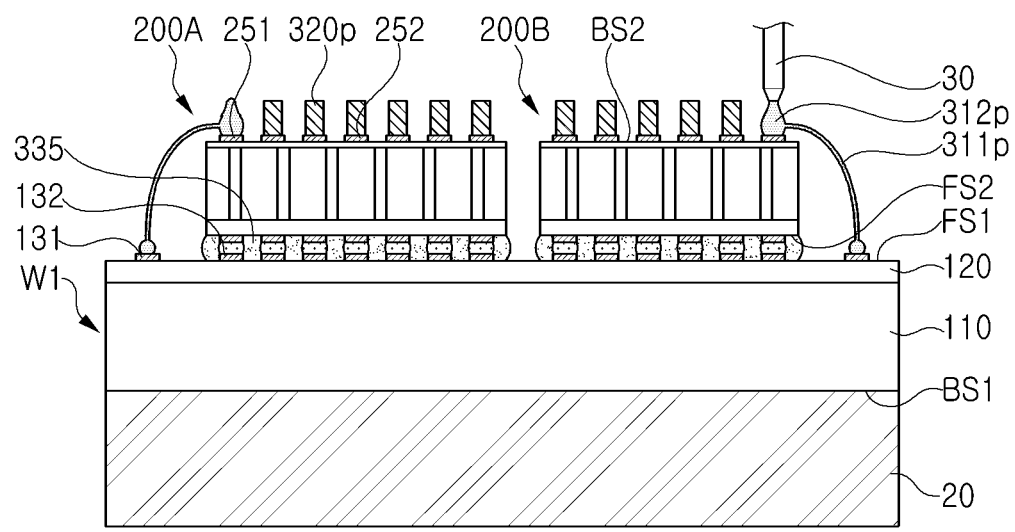

Referring to FIG. 8B, in an embodiment, after attaching the at least one second semiconductor chip 200A or 200B onto the first semiconductor wafer W1, a bonding wire 311$p$ that electrically connects the first front surface pads 131 of the first group and the first rear surface pads 251 of the first group, and a stud bump 312$p$ on the second rear surface pads 251 of the first group are formed. The bonding wire 311$p$ and the stud bump 312$p$ are formed by a wire bonding process that uses a capillary 30. For example, the stud bump 312$p$ is integrally formed with the bonding wire 311$p$. The at least one second semiconductor chip 200A or 200B is fixed by a thermal compression process. In the thermal compression process, the preliminary adhesive film layer 335 preflows to form an adhesive film 335.

Figure 8C:
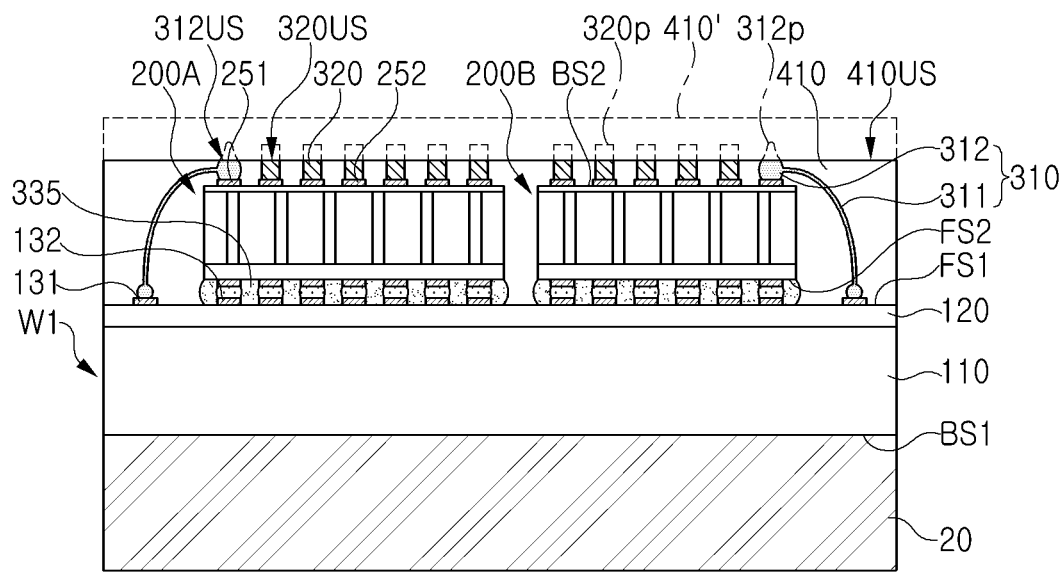

Referring to FIG. 8C, in an embodiment, a preliminary encapsulant 410' that covers the at least one second semiconductor chip 200A or 200B, the bonding wire 311$p$, the stud bump 312$p$, and the conductive posts 320$p$, is formed on the first semiconductor wafer W1. A polishing process is applied to the preliminary encapsulant 410' to form first bump structures 310, second bump structures 320, and an encapsulant 410. For example, a polishing process forms a stud portion 312 in which a portion of the stud bump 312$p$ of FIG. 8B is removed, and forms second bump structures 320 in which portions of the conductive posts 320$p$ of FIG. 8B are removed. The first bump structures 310 include a stud portion 312 on the second rear surface pads 251 of the first group, and a bonding wire portion 311 that extends from the stud portion 312.

An upper surface 312US of each of the first bump structures 310 and an upper surface 320US of each of the second bump structures 320 is exposed through an upper surface 410US of the encapsulant 410. The upper surface 410US of the encapsulant 410, the upper surface of the first bump structures 310 or the upper surface 312US of the stud portion 312, and the upper surface 320US of the second bump structures 320 are coplanar. In addition, the upper surface 312US of the stud portion 312 exposed through the upper surface 410US of the encapsulant 410 has a predetermined size. For example, a diameter of the upper surface 312US of the stud portion 312 is about 50 μm.

Figure 8D:
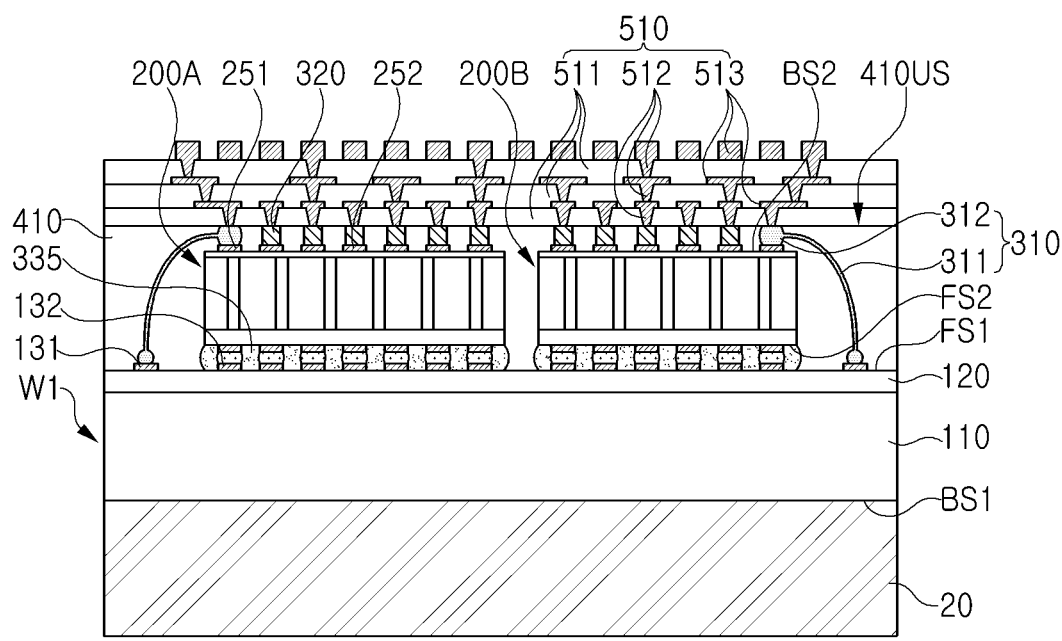

Referring to FIG. 8D, in an embodiment, a redistribution structure 510 is formed on the upper surface 410US of the encapsulant 410. The redistribution structure 510 includes redistribution layers 512 that are electrically connected to the first bump structures 310 or the second bump structures 320. The redistribution structure 510 includes an insulating layer 511, redistribution layers 512, and redistribution vias 513. The insulating layer 511 is formed by coating and curing a photosensitive resin such as PID on the upper surface 410US of the encapsulant 410. The redistribution layers 512 and the redistribution vias 513 are formed using one of a photolithography process, an etching process, or a plating process, etc.

According to embodiments of the present inventive concept, by introducing a bump structure that includes a bonding wire, a semiconductor package and a method of manufacturing the same are provided that have reduced manufacturing costs and increased yield.

While embodiments have been illustrated and described above, it will be apparent to those skilled in the art that modifications and variations could be made without departing from the scope of embodiments of the present inventive concept as defined by the appended claims.

What is claimed is:

1. A semiconductor package, comprising:
a first semiconductor chip that includes a first front surface on which first front surface pads of first and second groups are disposed;
a second semiconductor chip that includes a second front surface that faces the first front surface and on which are disposed second front surface pads that are electrically connected to the first front surface pads of the second group, a second rear surface opposite to the second front surface and on which are disposed second rear surface pads of first and second groups, and a through-electrode that electrically connects the second front surface pads and at least a portion of the second rear surface pads to each other;
first bump structures that include a stud portion disposed below the second rear surface pads of the first group and a bonding wire portion that extends from the stud portion and is connected to the first front surface pads of the first group;
second bump structures disposed below the second rear surface pads of the second group;
an encapsulant that encapsulates the second semiconductor chip and the first and second bump structures; and
a redistribution structure disposed below the encapsulant, wherein the redistribution structure includes an insulating layer, redistribution layers disposed below the insulating layer, and redistribution vias that penetrate through the insulating layer and connect the redistribution layers to the first bump structures or the second bump structures,
wherein at least a portion of the redistribution vias connected to the first bump structures is in direct contact with the stud portion.

2. The semiconductor package of claim 1, wherein the second rear surface pads of the first group are disposed adjacent to an edge of the second semiconductor chip.

3. The semiconductor package of claim 1, wherein the first front surface pads of the first group do not overlap the second semiconductor chip in a direction perpendicular to the first front surface.

4. The semiconductor package of claim 1, wherein the first bump structures comprise a metal that differs from that of the second bump structures.

5. The semiconductor package of claim 4, wherein the first bump structures comprise gold (Au) or an alloy of gold (Au).

6. The semiconductor package of claim 4, wherein the second bump structures comprise copper (Cu) or an alloy of copper (Cu).

7. The semiconductor package of claim 1, wherein a height of the stud portion in a direction perpendicular to the second rear surface is substantially equal to a height of each of the second bump structures.

8. The semiconductor package of claim 1, wherein a lower surface of the stud portion is substantially coplanar with a lower surface of each of the second bump structures and a lower surface of the encapsulant.

9. The semiconductor package of claim 8, wherein a diameter of the lower surface of the stud portion exposed through the encapsulant is about 30 μm or more.

10. The semiconductor package of claim 1, wherein a maximum width of the stud portion in a direction parallel to the second rear surface is greater than a maximum width of each of the second bump structures.

11. The semiconductor package of claim 1, further comprising:
third bump structures disposed between the first front surface of the first semiconductor chip and the second front surface of the second semiconductor chip, wherein the third bump structures connect the first front surface pads of the second group and the second front surface pads; and
an adhesive film interposed between the first front surface of the first semiconductor chip and the second front surface of the second semiconductor chip, wherein the adhesive film surrounds the third bump structures.

12. The semiconductor package of claim 1, wherein the first semiconductor chip further comprises a first insulating layer that surrounds the first front surface pads, wherein the first front surface is a flat surface provided by the first insulating layer and the first front surface pads,
the second semiconductor chip further comprises a second insulating layer that surrounds the second front surface pads, wherein the second front surface is a flat surface provided by the second insulating layer and the second front surface pads, and
the first front surface and the second front surface are in contact with each other.

13. A semiconductor package, comprising:
a first semiconductor chip that includes first front surface pads of first and second groups;
a second semiconductor chip disposed below the first semiconductor chip, wherein the second semiconductor chip includes second front surface pads that are electrically connected to the first front surface pads of the second group, and second rear surface pads of first and second groups located opposite to the second front surface pads;
first bump structures that include a stud portion disposed below the second rear surface pads of the first group, and a bonding wire portion that extends from the stud portion and is connected to the first front surface pads of the first group; and
a redistribution structure disposed below the second semiconductor chip, wherein the redistribution structure includes redistribution layers that are electrically connected to the first and second semiconductor chips,
wherein the first front surface pads of the first group are electrically connected to the redistribution layers through the first bump structures.

14. The semiconductor package of claim 13, further comprising second bump structures disposed below the second rear surface pads of the second group,
wherein the second rear surface pads of the second group are electrically connected to the redistribution layers through the second bump structures.

15. The semiconductor package of claim 13, wherein the second semiconductor chip further comprises a through-electrode that electrically connects the second front surface pads and the second rear surface pads.

16. A semiconductor package, comprising:
a first semiconductor chip that includes first pads of first and second groups;
a chip structure disposed below the first semiconductor chip, wherein the chip structure includes second upper pads that are electrically connected to the first pads of the second group, and second lower pads of first and second groups located opposite to the second upper pads;

first bump structures that include a stud portion disposed below the second lower pads of the first group, and a bonding wire portion that extends from the stud portion and is connected to the first pads of the first group;

second bump structures disposed below the second lower pads of the second group; and a redistribution structure disposed below the chip structure, wherein the redistribution structure includes redistribution layers that are electrically connected to the first and second bump structures.

17. The semiconductor package of claim 16, wherein the first semiconductor chip includes a first surface and a second surface that are opposite to each other, wherein the first pads of the first and second groups are disposed below the second surface, and the chip structure includes a third surface and a fourth surface that are opposite to each other, wherein the second upper pads are disposed on the third surface, and the second lower pads of the first and second groups are disposed below the fourth surface.

18. The semiconductor package of claim 17, wherein a height from the first surface to the second surface of the first semiconductor chip is less than a height from the third surface to the fourth surface of the chip structure.

19. The semiconductor package of claim 17, wherein a height from the second surface of the first semiconductor chip to the fourth surface of the chip structure is about 100 µm or more.

20. The semiconductor package of claim 16, wherein the chip structure comprises a plurality of second semiconductor chips.

* * * * *